(12) United States Patent
Parmon

(10) Patent No.: US 10,615,130 B1
(45) Date of Patent: Apr. 7, 2020

(54) DEVICES AND METHODS FOR ISOLATING SIGNALS IN SEMICONDUCTOR DEVICES

(71) Applicant: NXP USA, Inc., Austin, TX (US)

(72) Inventor: Walter Parmon, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/204,648

(22) Filed: Nov. 29, 2018

(51) Int. Cl.
| | |
|---|---|
| H01L 23/552 | (2006.01) |
| H01L 23/31 | (2006.01) |
| H01L 21/56 | (2006.01) |
| H01L 21/48 | (2006.01) |
| H01L 23/498 | (2006.01) |

(52) U.S. Cl.
CPC ........ H01L 23/552 (2013.01); H01L 21/4853 (2013.01); H01L 21/56 (2013.01); H01L 23/3114 (2013.01); H01L 23/49811 (2013.01)

(58) Field of Classification Search
CPC .............. H01L 23/552; H01L 21/4853; H01L 23/49811; H01L 23/3114; H01L 21/56
USPC ......................................................... 257/659
See application file for complete search history.

(56) References Cited

U.S. PATENT DOCUMENTS

| | | | |
|---|---|---|---|
| 6,723,629 B2 * | 4/2004 | Hotchkiss | ........... H01L 21/4839 438/612 |
| 8,071,431 B2 | 12/2011 | Hoang et al. | |
| 8,558,398 B1 | 10/2013 | Seetharam | |
| 9,107,303 B2 | 8/2015 | Lytle et al. | |
| 9,455,157 B1 * | 9/2016 | Jain | ................... H01L 23/49541 |
| 9,490,222 B1 | 11/2016 | Awujoola et al. | |
| 9,935,075 B2 | 4/2018 | Huang et al. | |
| 10,292,271 B2 * | 5/2019 | Ino | ....................... H05K 1/0206 |
| 2006/0043587 A1 | 3/2006 | Lim et al. | |
| 2013/0043961 A1 * | 2/2013 | Gebauer | .............. H03H 9/0566 333/133 |
| 2016/0043813 A1 | 2/2016 | Chen et al. | |

* cited by examiner

*Primary Examiner* — Vu A Vu
(74) *Attorney, Agent, or Firm* — Mary Jo Bertani

(57) ABSTRACT

A packaged semiconductor device includes a substrate having a ground plane, a first communication port on the substrate, a second communication port on the substrate adjacent the first communication port, and grounding structures on the substrate. Each of the grounding structures is in contact with two different locations on the ground plane and is adjacent to one of the first and second communication ports. An electrically insulating material completely covers a top side of each of the grounding structures.

20 Claims, 6 Drawing Sheets

DEVICES AND METHODS FOR ISOLATING SIGNALS IN SEMICONDUCTOR DEVICES

BACKGROUND

Field

This disclosure relates generally to semiconductor devices, and more specifically, to isolating signals in semiconductor devices.

Related Art

Signal crosstalk is a common problem in integrated circuit packages with wireless communication components, such as radio frequency (RF) or millimeter wave (mmW) receivers and transmitters. The crosstalk is commonly caused by electromagnetic coupling of signals between communication ports that are in close proximity to one another. To inhibit crosstalk, an extended ground plane (EGP) can be used to isolate signals between the ports. The EGP is a ring-shaped (or O-shaped) metal component that is electrically connected to a bottom metal layer of the package through an array of vias. The sides of the O surround a die and associated communication ports. The placement and alignment of the EGP must be controlled so that notches in the EGP at least partially isolate the communication ports from one another. This adds to the cost of the package. In addition, the EGP achieves isolation of approximately −35 decibels, which may not be sufficient for some applications.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of semiconductor or integrated circuit devices disclosed herein isolate and shield a desired signal line from interfering signals in integrated circuit or semiconductor packages. Structures that provide isolation between receive (RX) channels, transmit (TX) channels, and TX to RX channels are shown. In some embodiments, isolation is achieved by adding isolation or grounding structures around at least a portion of the communication ports. The grounding structures are coupled or connected to a ground plane in a substrate below the grounding structures. The height, length and position of the grounding structures can be designed to isolate signals with particular frequencies. For example, high isolation performance can be achieved by adding a Bond Wire Array (BWA) in a fan out region of a fan out wafer level package to confine the electromagnetic (EM) fields to the IC package. Examples of IC packages that can utilize the grounding structures include radio frequency (RF) and millimeter wave (mmW) packages.

Figure 1:
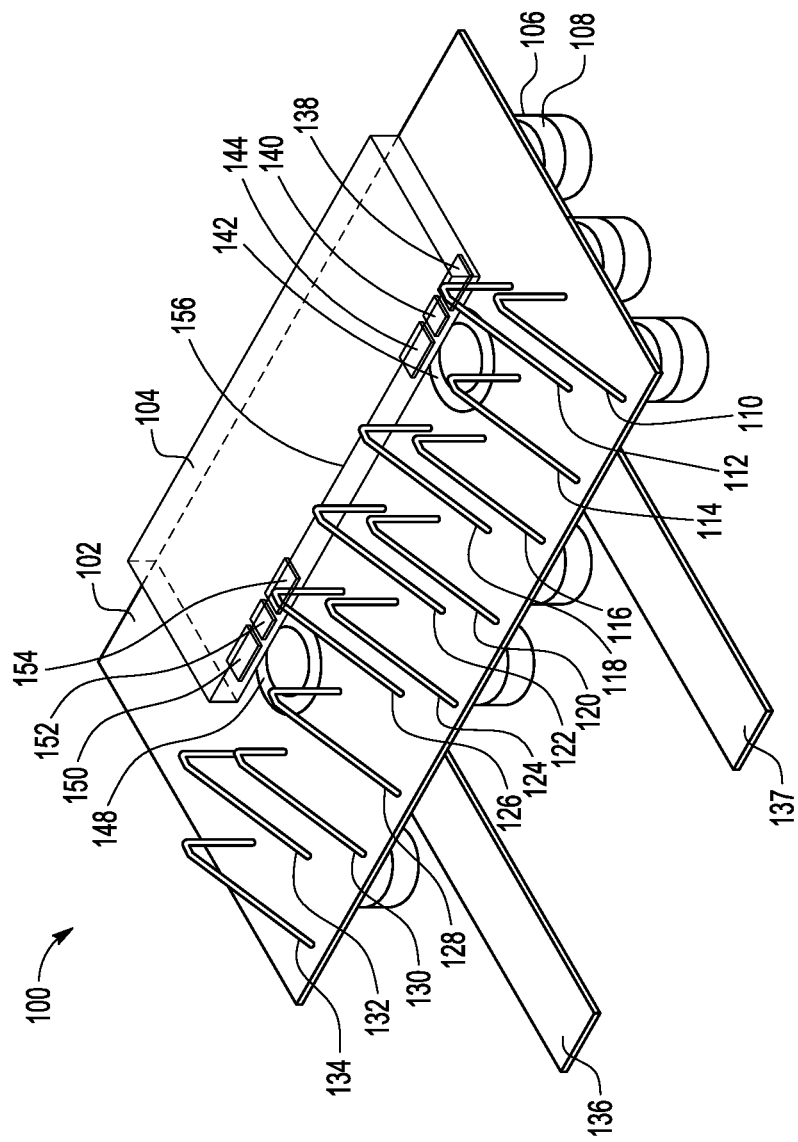
FIG. 1 is a top perspective view of a semiconductor device in accordance with selected embodiments of the present invention.
Figure 2:
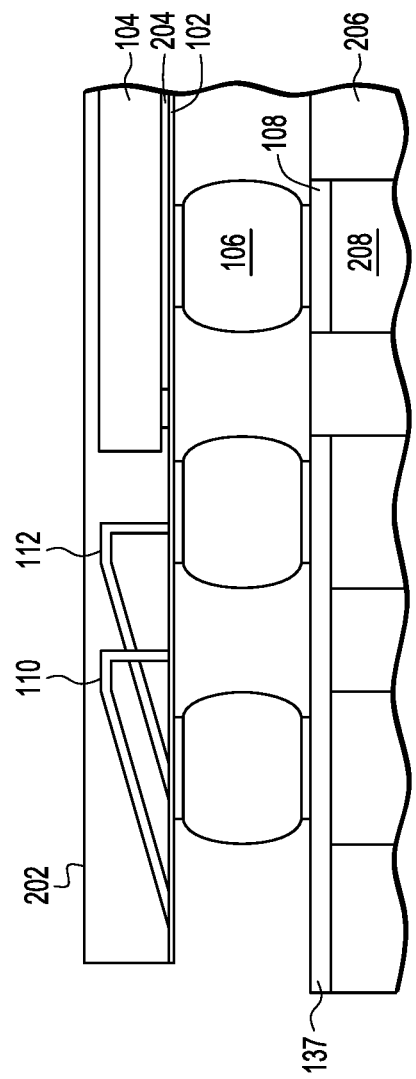
FIG. 2 is a side view of the semiconductor device of FIG. 1

FIG. 1 is a perspective view of a semiconductor device 100 in accordance with selected embodiments of the present invention including metal layer 102 with a first major surface on which integrated circuit die 104 is mounted. Solder balls 106 on a second major surface of metal layer 102 that is opposite the first major surface are attached to conductive pads 108 to provide a connection between die 104 and other components (not shown) external to die 104. A plurality of grounding structures 110, shown as wirebonds, are positioned in various locations in fan out region of metal layer 102. Each end of grounding structures 110, 112, 114, 116, 118, 120, 122, 124, 126, 128, 130, 132, 134 (collectively, "110-134") is in direct contact with a metal contact or metal layer 102 that serves as a ground plane. For example, the first metal layer of metal layer 102, referred to as Ml, can be used as the ground plane. FIG. 2 shows an example of ground plane 102 that serves as an electrical ground for wirebonds 110, 112. Grounding structures 110-134 can be implemented using other types of structures, such as electrically conductive structures that are printed using a three-dimensional printer, pillars formed at an angle to contact a neighboring pillar, or other suitable structure having two ends in contact with ground plane 102.

Die 104 can include a transmitter and/or receiver that sends and/or receives signals through transmission lines 136, 137 coupled to respective communication ports 142, 148. Communication ports 142, 148 are adjacent to one another and are also connected to die 104 through respective contacts 140, 152 and to electrical ground, for example, ground plane 102 of FIG. 2, through respective ground contacts 138, 144, 150, 154. Since die 104 may be relatively small, there may not be sufficient distance between communication ports 142, 148 to prevent or avoid crosstalk between signals communicated to or from communication ports 142, 148. Grounding structures 110-134 are placed to help isolate signals to/from communication ports 142, 148 from each other. Communication ports 142, 148 are shown as circular structures but may have other suitable shapes.

Grounding structures 112, 118 are placed on opposite sides of communication port 142 close to edge 156 of die 104 and communication port 142. Grounding structures 114, 116 are positioned next to one another and close to the perimeter of communication port 142 between grounding structures 112, 118.

Grounding structures 126, 132 are placed on opposite sides of communication port 148 close to edge 156 of die 104 and communication port 148. Grounding structures 128, 130 are positioned next to one another and close to the perimeter of communication port 148 between grounding structures 126, 132.

Grounding structures 120, 122, 124 are between grounding structures 118, 126 and positioned at staggered distances from edge 156 of die 104.

Grounding structures 110-134 can have the same or any combination of different lengths, heights, widths, shapes, positions and orientations. In the example shown, grounding structures 110-134 have the same height, length and width and are parallel to one another and perpendicular to edge 156 of die 104, with a first end closer to edge 156 of die 104 than a second end that is positioned further from edge 156 of die 104.

The configuration of grounding structures 110-134 can be selected to isolate a particular frequency or range of frequencies. Different channel frequencies may require different heights, lengths, widths and positioning of grounding structures 110-134 on the same metal layer 102. For example, grounding structures 110-120 may be used to isolate signals in a particular range of frequencies and may be taller than grounding structures 122-134 used to isolate signals having other frequencies. In other cases, the signals to/from communication ports 144, 148 may have the same frequencies, so grounding structures 110-134 may have the same dimensions and similar orientations. Further, grounding structures 110-134 can have a radial orientation, be perpendicular to one another, be staggered with respect to one another, or a combination of orientations and positions with respect to one another and to communication ports 142, 148.

Communication ports 142, 148 that can be implemented using a power splitter, such as a Wilkinson power splitter, to help reduce crosstalk. Communication ports 142, 148 are coupled to respective ground contacts 138, 144, 150, 154 on one end, and to an end of respective transmission lines 136, 137 at an opposite end. Another end of transmission lines 136, 137 are coupled to respective antenna devices (not shown). Transmission lines 136, 137 can be implemented as conductive traces on a printed circuit board (not shown). A ball grid array with solder balls 106 coupled to conductive pads 108 (FIG. 1) on the printed circuit board can be used to connect transmission lines 136, 137 to respective communication ports 142, 148.

Communication ports 142, 148 are coupled to die 102 through respective contacts 140, 152. In addition to using a power splitter to reduce crosstalk between communication ports 142, 148, grounding structures 110-134 further reduce crosstalk by surrounding the sides of communication ports 142, 148 by preventing signals from one port 142 from interfering with signals on the other port 148, and vice versa.

FIG. 2 is a side view of the semiconductor device of FIG. 1 and further shows wirebonds 110, 112 and die 104 encased in an insulating or encapsulating material 202. Encapsulating material 202 can be molded using a mold compound that is cured to create a protective covering that electrically and chemically insulates wirebonds 110, 112 and die 104 from the external environment. In addition, dielectric layer 204 is included over metal layer 102. Die 104 can include conductive pads that are coupled to solder balls 106 through dielectric layer 204 and metal layer 102. Printed circuit board (PCB) 206 can include several layers including one or more power, ground, and routing layers with insulating layers between, however, only a top core layer of PCB 206 is shown in FIG. 2. Transmission line 137 is formed as a conductive strip over the top layer of PCB 206. Solder balls 106 contact conductive pads 108, and conductive pads 108 are in contact with conductive vias 208. Conductive vias 208 are placed through one or more layers of PCB 206 to connect die 104 to power, ground, and other components mounted to PCB 206 via a routing layer. Die 104 may be attached to PCB 208 using multiple solder balls 106 for different signals, although die 104 is only shown attached to one solder ball 106 in FIG. 2.

The height of encapsulating material 202 is greater than the height of grounding structures 110, 112, as only the ends of grounding structures 110, 112 contact ground plane 110. As such, there is no need for a ground plane to be included on top of encapsulating material 202, or for grounding structures 110, 112 to be as high or higher than encapsulating material 202 to contact an upper ground plane.

Figure 3:
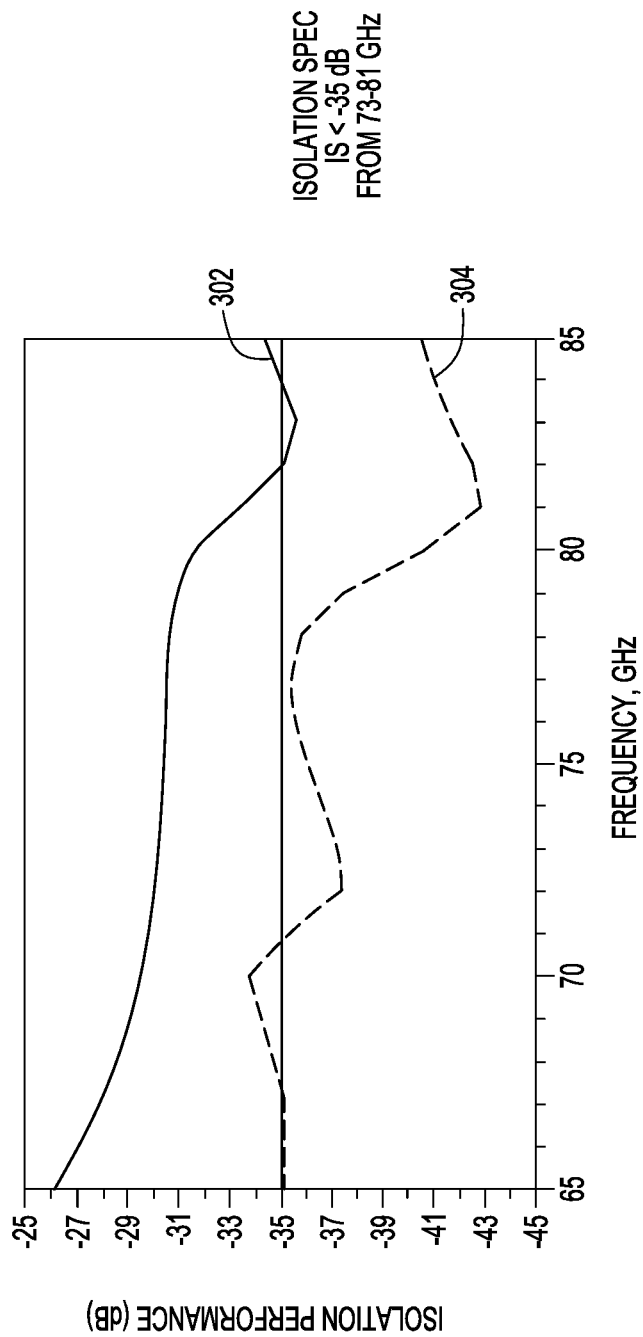
FIG. 3 illustrates a set of curves that compare an example of isolation of signals with no isolation structures with isolation achieved with an extended ground plane.

FIG. 3 illustrates a set of curves from an electromagnetic simulation tool showing examples of isolation performance with no isolation structure(s) and isolation performance with an extended ground plane (EGP) isolation structure as known in the prior art. With no isolation structure, isolation performance shown in curve 302 is between −29.5 and −33 decibels in the specified frequency range between 73 and 81 GigaHertz (GHz). The isolation performance indicated by curve 302 with no isolation structures fails to meet a specification requiring less than −35 decibels crosstalk for a frequency range between 73 and 81 GHz.

Curve 304 shows an example of isolation performance with an EGP isolation structure. For a specification requiring isolation performance less than −35 decibels from 73 to 81 GHz, the configuration with an EGP isolation structure as represented by curve 304 provides highly nonlinear isolation performance between −37 and −43 decibels in the specified frequency range. Between a frequency of 76 to 78 GHz, isolation performance is approximately −35.5 decibels, which is close to the minimum isolation specified.

Figure 4:
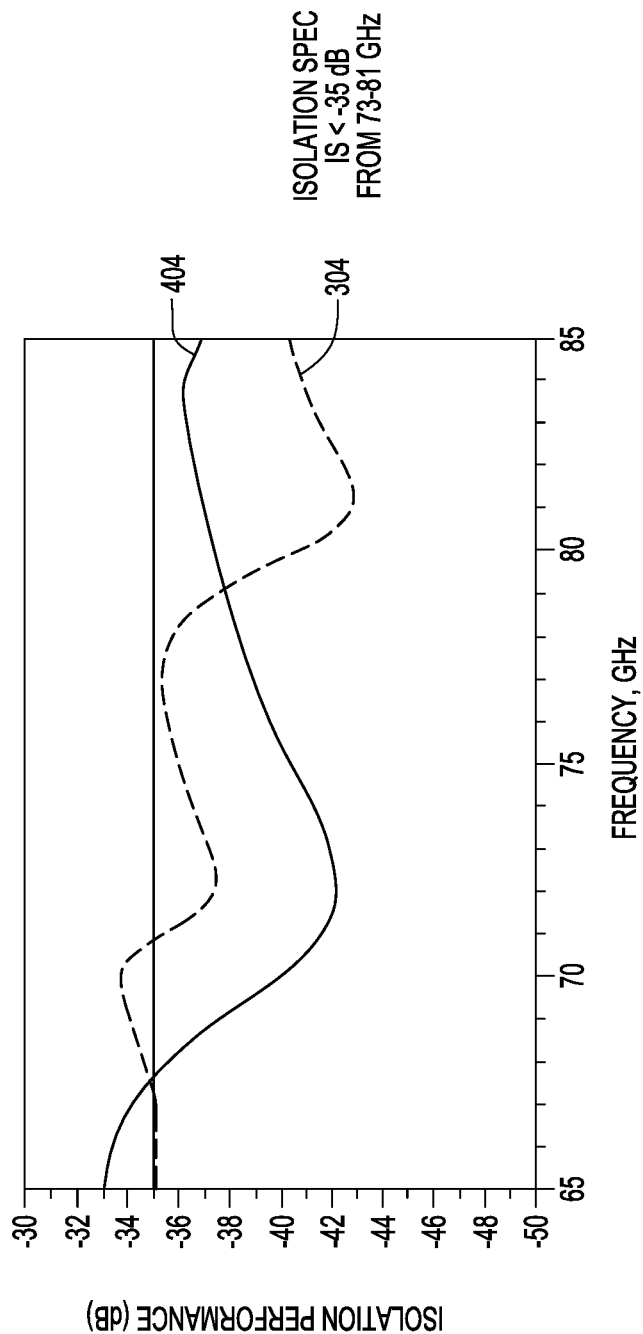
FIG. 4 illustrates an example of a set of curves showing isolation achieved for a selected configuration of isolation structures in accordance with the present invention compared to isolation achieved with an extended ground plane.

FIG. 4 illustrates an example of a set of curves from an electromagnetic simulation tool showing isolation performance for a selected configuration of isolation or grounding structures in accordance with the present invention compared to curve 304 from FIG. 3 showing isolation performance with an extended ground plane. Grounding structures 110-134 with a configuration shown in FIG. 1 and a height of 120 micrometers is used in the example of curve 404. Assume a specification requiring isolation performance less than −35 decibels from 73 to 81 GHz. The isolation performance of a configuration with grounding structures 110-134 as represented by curve 404 exhibits approximately linear isolation performance ranging from −42 decibels at a frequency of 73 GHz to −37 decibels at 81 GHz. Between frequencies from 73 to 78.5 GHz, isolation performance is −2 to −4 decibels better than isolation performance illustrated by curve 304.

Figure 5:
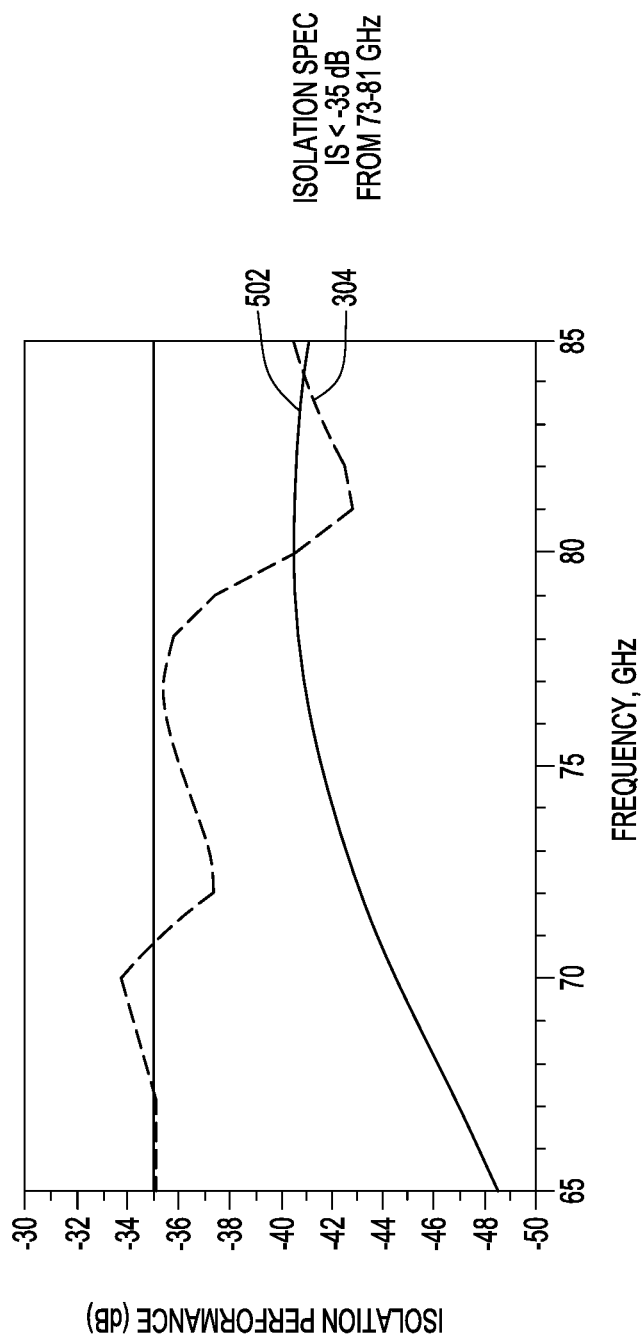
FIG. 5 illustrates an example of a set of curves showing isolation achieved for another selected configuration of isolation structures in accordance with the present invention compared to isolation achieved with an extended ground plane.

FIG. 5 illustrates an example of a set of curves from an electromagnetic simulation tool showing isolation performance for another selected configuration of isolation or grounding structures in accordance with the present invention compared to curve 304 from FIG. 3 showing isolation performance with an extended ground plane. Grounding structures 110-134 with a configuration shown in FIG. 1 and a height of 300 micrometers is used in the example of curve 504. Assume a specification requiring isolation performance less than −35 decibels from 73 to 81 GHz. The configuration with grounding structures as represented by curve 502 exhibits isolation performance along a slight curve ranging from −43 decibels at a frequency of 73 GHz to −40.5 decibels at 81 GHz. Between frequencies from 73 to 78.5 GHz, isolation performance is approximately −8 decibels better than isolation performance illustrated by curve 304.

Figure 6:
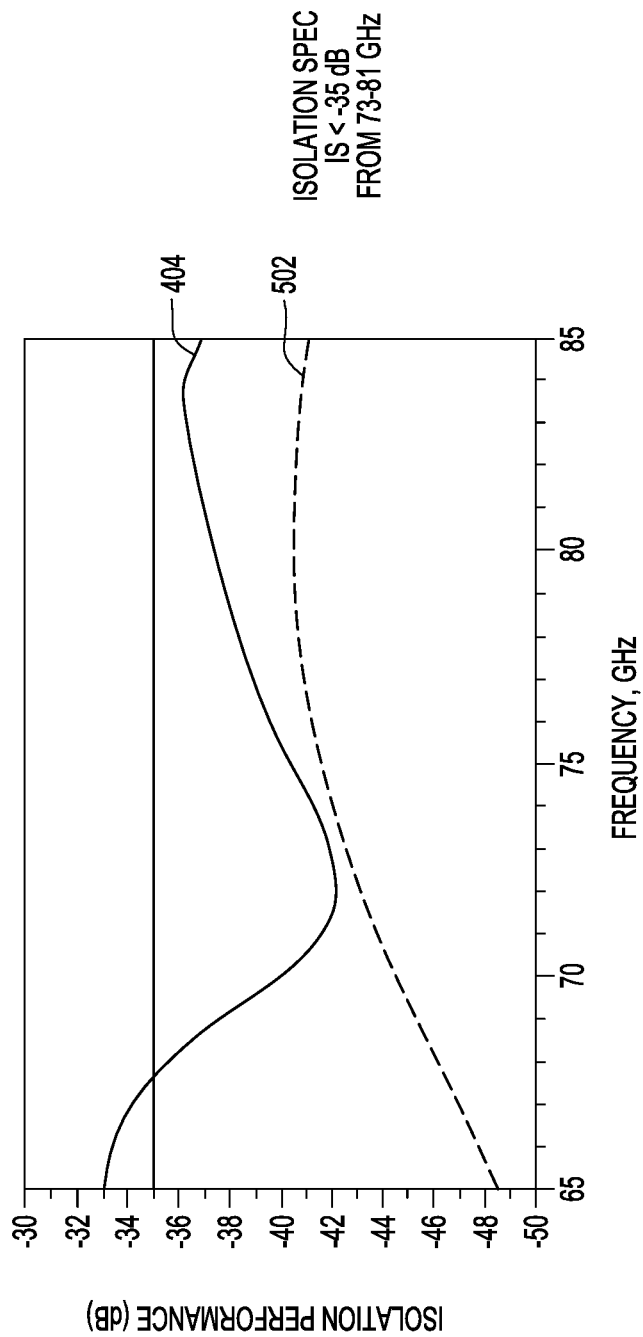
FIG. 6 shows the isolation performance curves from FIGS. 4 and 5 for the respective configuration of isolation or grounding structures.

FIG. 6 shows the isolation performance curves from FIGS. 4 and 5 for the respective configuration of isolation or grounding structures in accordance with the present invention. The isolation performance of curve 404 represents grounding structures with a height of 120 micrometers while curve 502 represent isolation performance of grounding structures with a height of 300 micrometers. Both curves 404, 502 show the respective grounding structure configurations are well under the specification isolation performance of −35 dB over the entire range of frequencies from 65 to 85 GHz. While the isolation performance of curve 404 degrades at higher frequencies compared to curve 502, it is contemplated that a combination of grounding structures with different heights can be used in the same device to achieve more robust isolation over a wider range of frequencies than using just one configuration of grounding structures alone. The selected configuration of grounding structures can be customized based on the expected range of frequency and the specified isolation requirements.

By now it should be appreciated that in some embodiments, there has been provided a semiconductor device (100) comprising a substrate having a metal layer (102) that provides a ground plane, a first communication port (142) on the substrate, a second communication port (148) on the substrate adjacent the first communication port, and grounding structures (110-134) on the substrate. Each of the grounding structures is in contact with two different locations on the ground plane and is adjacent to one of the first and second communication ports. An electrically insulating material (202) is in direct contact with and completely covers a top side of each of the grounding structures.

In one aspect, a first set of the grounding structures (110-118) are positioned to surround at least a portion of the first communication port and a second set of the grounding structures (126-132) are positioned to surround at least a portion of the second communication port.

In another aspect, at least two of the grounding structures have different maximum heights.

In another aspect, at least two of the grounding structures have different lengths.

In another aspect, at least two of the grounding structures have different orientations with respect to one another.

In another aspect, at least some of the grounding structures are wirebonds.

In another aspect, the device can further comprise a processing die coupled to the first and second communication ports.

In another aspect, the processing die, the grounding structures, and the first and second communication ports are encapsulated in a ball grid array package.

In another aspect, the device can further comprise a first transmission line coupled to the first communication port, and a second transmission line coupled to the second communication port.

In another aspect, the device can further comprise the electrically insulating material is an encapsulating material.

In other embodiments, a semiconductor device can comprise a ground plane, a first communication port coupled to the ground plane, and a first plurality of grounding structures surrounding at least a portion of the first communication port. Each of the first plurality of grounding structures includes a first end connected to the ground plane, a second end connected to the ground plane, and a first maximum height. Encapsulating material is over the first plurality of grounding structures. A height of the encapsulating material is greater than the first maximum height over the first plurality of grounding structures.

In another aspect, the device can further comprise a second communication port coupled to the ground plane, and a second plurality of grounding structures surrounding at least a portion of the second communication port. Each of the second plurality of grounding structures includes a first end connected to the ground plane, a second end connected to the ground plane, and a second maximum height. Encapsulating material is over the second plurality of grounding structures. The height of the encapsulating material is greater than the second maximum height over the second plurality of grounding structures.

In another aspect, the first maximum height is designed to isolate signals at a selected frequency associated with the first communication port.

In another aspect, the second maximum height is designed to isolate signals at a selected frequency associated with the second communication port.

In another aspect, the first and second plurality of grounding structures are formed with one of a group consisting of wirebonds and three dimensional printed structures.

In another aspect, at least some of the first and second plurality of grounding structures have different first and second maximum heights.

In another aspect, the device can further comprise a processing die coupled to the first and second communication ports.

In another aspect, the processing die, the first and second plurality of grounding structures and the first and second communication ports are encapsulated in a ball grid array package.

In another aspect, only the first and second ends of each of the first plurality of grounding structures are in contact with an electrical ground.

In another aspect, a distance between the first and second ends of at least one of the first plurality of grounding structures is different than a distance between the first and second ends of at least another one of the first plurality of grounding structures.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The semiconductor substrate described herein can be any semiconductor material or combinations of materials, such as gallium arsenide, silicon germanium, silicon-on-insulator (SOI), silicon, monocrystalline silicon, the like, and combinations of the above.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Semiconductor and other types of electronic devices are often encapsulated wholly or partly in plastic resin to provide environmental protection and facilitate external connection to the devices. For convenience of explanation and not intended to be limiting, the present invention is described for semiconductor devices, but persons of skill in the art will understand that the present invention applies to any type of electronic device that is substantially in chip form. Accordingly, such other types of devices including the non-limiting examples given below, are intended to be included in the terms "device", "electronic device", "semiconductor device" and "integrated circuit" whether singular or plural, and the terms "device", "die" and "chip" are intended to be substantially equivalent. Non-limiting examples of suitable devices are semiconductor integrated circuits, individual semiconductor devices, piezoelectric devices, magnetostrictive devices, solid state filters, magnetic tunneling structures, integrated passive devices such as capacitors, resistors and inductors, and combinations and arrays of any and all of these types of devices and elements. Further, the present invention does not depend upon the types of die or chips being used nor the materials of which they are constructed provided that such materials withstand the encapsulation process.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   a substrate having a metal layer that provides a ground plane;
   a first communication port on the substrate;
   a second communication port on the substrate adjacent the first communication port;
   grounding structures on the substrate, wherein each of the grounding structures is in contact with two different locations on the ground plane, and is positioned to increase isolation between signals of the first communication port and signals of the second communication port;
   an electrically insulating material in direct contact with and completely covering a top side of each of the grounding structures.

2. The device of claim 1 wherein:
   a first set of the grounding structures are positioned to surround at least a portion of the first communication port and a second set of the grounding structures are positioned to surround at least a portion of the second communication port.

3. The device of claim 1 wherein at least two of the grounding structures have different maximum heights.

4. The device of claim 1 wherein at least two of the grounding structures have different lengths.

5. The device of claim 1 wherein at least two of the grounding structures have different orientations with respect to one another.

6. The device of claim 1 wherein
   at least some of the grounding structures are wirebonds.

7. The device of claim 1 further comprising:
   a processing die coupled to the first and second communication ports.

8. The device of claim 7 wherein:
   the processing die, the grounding structures, and the first and second communication ports are encapsulated in a ball grid array package.

9. The device of claim 1 further comprising:
   a first transmission line coupled to the first communication port; and
   a second transmission line coupled to the second communication port.

10. The device of claim 8 further comprising:
    the electrically insulating material is an encapsulating material.

11. A semiconductor device comprising:
    a ground plane;
    a first communication port coupled to the ground plane;
    a first plurality of grounding structures surrounding at least a portion of the first communication port to increase isolation of signals for the first communication port, wherein each of the first plurality of grounding structures includes a first end connected to the ground plane, a second end connected to the ground plane, and a first maximum height; and
    encapsulating material over the first plurality of grounding structures, wherein a height of the encapsulating material is greater than the first maximum height over the first plurality of grounding structures.

12. The semiconductor device of claim 11 further comprising:
    a second communication port coupled to the ground plane;
    a second plurality of grounding structures surrounding at least a portion of the second communication port to increase isolation of signals for the second communication port, wherein each of the second plurality of grounding structures includes a first end connected to the ground plane, a second end connected to the ground plane, and a second maximum height; and
    encapsulating material over the second plurality of grounding structures, wherein the height of the encapsulating material is greater than the second maximum height over the second plurality of grounding structures.

13. The semiconductor device of claim 11 wherein:
    the first maximum height is designed to isolate signals at a selected frequency associated with the first communication port.

14. The semiconductor device of claim 12 wherein:
    the second maximum height is designed to isolate signals at a selected frequency associated with the second communication port.

15. The semiconductor device of claim 11 wherein:
the first and second plurality of grounding structures are formed with one of a group consisting of wirebonds and three dimensional printed structures.

16. The semiconductor device of claim 11 wherein:
at least some of the first and second plurality of grounding structures have different first and second maximum heights.

17. The semiconductor device of claim 12 further comprising:
a processing die coupled to the first and second communication ports.

18. The semiconductor device of claim 17 wherein:
the processing die, the first and second plurality of grounding structures and the first and second communication ports are encapsulated in a ball grid array package.

19. The semiconductor device of claim 11 wherein:
only the first and second ends of each of the first plurality of grounding structures are in contact with an electrical ground.

20. The semiconductor device of claim 11 wherein a distance between the first and second ends of at least one of the first plurality of grounding structures is different than a distance between the first and second ends of at least another one of the first plurality of grounding structures.

* * * * *